United States Patent
Han et al.

(10) Patent No.: US 12,241,943 B2
(45) Date of Patent: Mar. 4, 2025

(54) METHOD FOR EARLY DETECTION OF AN INTERNAL SHORT IN A BATTERY PACK

(71) Applicant: GM Global Technology Operations LLC, Detroit, MI (US)

(72) Inventors: Taeyoung Han, Bloomfield Hills, MI (US); Jun-mo Kang, Ann Arbor, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 716 days.

(21) Appl. No.: 17/375,491

(22) Filed: Jul. 14, 2021

(65) Prior Publication Data

US 2023/0017485 A1  Jan. 19, 2023

(51) Int. Cl.
| | |
|---|---|
| G01R 31/52 | (2020.01) |
| G01R 31/396 | (2019.01) |
| H01M 10/44 | (2006.01) |
| H02J 7/00 | (2006.01) |
| G01R 31/00 | (2006.01) |
| G01R 31/36 | (2020.01) |

(52) U.S. Cl.
CPC .......... *G01R 31/52* (2020.01); *G01R 31/396* (2019.01); *H01M 10/441* (2013.01); *H02J 7/00718* (2020.01); *G01R 31/007* (2013.01); *G01R 31/3646* (2019.01); *H01M 2220/20* (2013.01)

(58) Field of Classification Search
CPC ............ H01M 2220/20; H01M 10/44; H01M 10/441; G01R 31/52; G01R 31/396; G01R 31/3646; H02J 7/00718
USPC .................. 320/134, 108, 109; 324/426, 433
See application file for complete search history.

(56) References Cited

U.S. PATENT DOCUMENTS

| | | | | |
|---|---|---|---|---|
| 3,835,362 A | * | 9/1974 | Greene ................. | H02J 7/0047 320/DIG. 19 |
| 5,444,378 A | * | 8/1995 | Rogers ............... | G01R 31/3832 320/136 |
| 5,945,805 A | * | 8/1999 | Takei .................. | H02J 7/00047 320/124 |
| 7,492,126 B2 | * | 2/2009 | Hogari ............... | G01R 31/3842 320/132 |
| 7,795,843 B2 | * | 9/2010 | Keates .................. | G01R 31/52 320/134 |
| 8,049,465 B2 | * | 11/2011 | Barsoukov .......... | H01M 10/482 320/132 |

(Continued)

FOREIGN PATENT DOCUMENTS

WO   WO-2019145976 A1 *  8/2019

OTHER PUBLICATIONS

WO2019145976A1_English_Translation (Year: 2019).*

*Primary Examiner* — John T Trischler
(74) *Attorney, Agent, or Firm* — CANTOR COLBURN LLP (57) ABSTRACT

A vehicle, system and method of detecting an internal short in a battery pack of the vehicle. The system includes a plurality of sensors and a processor. The plurality of sensors obtains states of charge at battery cells of the battery pack. The processor discharges the battery pack to identify a first set of the battery cells based on the states of charge of the battery cells, charges the battery pack to identify a second set of the battery cells based on the states of charge of the battery cells, and generates an alarm when an intersection of the first set and the second set is non-empty.

20 Claims, 6 Drawing Sheets

(56) References Cited

U.S. PATENT DOCUMENTS

| | | | | |
|---|---|---|---|---|
| 8,148,993 B2* | 4/2012 | Yamabe | B60W 10/08 | 324/433 |
| 8,253,383 B2* | 8/2012 | Li | G01R 31/396 | 320/134 |
| 8,334,699 B2* | 12/2012 | Asakura | H01M 10/4235 | 320/152 |
| 8,796,993 B2* | 8/2014 | White | G01R 31/3648 | 324/427 |
| 8,860,375 B2* | 10/2014 | Chen | H02J 7/342 | 320/134 |
| 9,395,420 B2* | 7/2016 | White | H01M 10/42 | |
| 9,531,038 B2* | 12/2016 | Thompson | H01M 10/4257 | |
| 9,640,843 B2* | 5/2017 | Horito | B60L 58/15 | |
| 9,859,751 B2* | 1/2018 | Shin | H02J 7/34 | |
| 10,295,606 B2* | 5/2019 | McCoy | G01R 31/385 | |
| 10,312,701 B2* | 6/2019 | Li | H02J 7/0071 | |
| 10,626,837 B1* | 4/2020 | Vutetakis | H01M 50/583 | |
| 10,644,520 B2* | 5/2020 | Yang | H01M 10/425 | |
| 10,693,197 B2* | 6/2020 | Thompson | H02J 7/00302 | |
| 10,809,302 B2* | 10/2020 | Yuan | H01M 10/48 | |
| 10,908,227 B2* | 2/2021 | Ling | G01R 31/52 | |
| 10,978,889 B1* | 4/2021 | Goldin | G01R 31/396 | |
| 11,035,904 B2* | 6/2021 | Cho | G01R 31/392 | |
| 11,125,786 B2* | 9/2021 | Bergmann | G01R 19/16542 | |
| 11,186,198 B2* | 11/2021 | Chen | H01M 10/44 | |
| 11,275,125 B2* | 3/2022 | Yang | G01R 31/3842 | |
| 11,289,925 B2* | 3/2022 | Cho | H02J 7/0047 | |
| 11,442,110 B2* | 9/2022 | Talukdar | G01R 31/371 | |
| 11,456,610 B2* | 9/2022 | Kim | H02J 7/0047 | |
| 11,460,513 B2* | 10/2022 | Hendrickson | H01M 10/482 | |
| 11,614,494 B2* | 3/2023 | Hao | G01R 31/52 | 324/426 |
| 11,724,620 B2* | 8/2023 | Martinsson | H02J 7/00306 | 320/132 |
| 11,846,683 B2* | 12/2023 | Kim | G01R 31/3842 | |
| 12,111,361 B2* | 10/2024 | Lee | G01R 31/52 | |
| 12,122,262 B2* | 10/2024 | Lee | G01R 31/396 | |
| 12,123,922 B2* | 10/2024 | Lim | H01M 10/425 | |
| 2003/0197512 A1* | 10/2003 | Miller | G01R 31/3648 | 324/426 |
| 2005/0024020 A1* | 2/2005 | Hogari | G01R 31/3842 | 320/132 |
| 2008/0125932 A1* | 5/2008 | Yamabe | B60K 6/365 | 701/31.4 |
| 2009/0099799 A1* | 4/2009 | Barsoukov | G01R 31/382 | 702/63 |
| 2009/0155674 A1* | 6/2009 | Ikeuchi | H01M 10/482 | 429/91 |
| 2009/0167312 A1* | 7/2009 | Keates | G01R 31/52 | 320/162 |
| 2010/0188050 A1* | 7/2010 | Asakura | G01R 31/52 | 320/136 |
| 2010/0194345 A1* | 8/2010 | Li | G01R 31/396 | 361/88 |
| 2013/0038295 A1* | 2/2013 | Kao | H02J 7/00306 | 320/136 |
| 2013/0057217 A1* | 3/2013 | Chen | H02J 7/342 | 320/114 |
| 2013/0063074 A1* | 3/2013 | Lin | H02J 7/0041 | 320/134 |
| 2013/0065093 A1* | 3/2013 | White | G01R 31/3648 | 429/50 |
| 2014/0167780 A1* | 6/2014 | White | G01R 31/3648 | 324/538 |
| 2014/0184235 A1* | 7/2014 | Ikeuchi | H01M 10/443 | 324/427 |
| 2014/0266229 A1* | 9/2014 | McCoy | G01R 31/385 | 324/434 |
| 2015/0037624 A1* | 2/2015 | Thompson | H02J 7/00302 | 429/61 |
| 2016/0105054 A1* | 4/2016 | Horito | H02J 7/0031 | 320/134 |
| 2016/0149271 A1* | 5/2016 | Horito | H01M 10/482 | 320/112 |
| 2016/0190865 A1* | 6/2016 | Shin | H02J 7/34 | 307/65 |
| 2016/0218531 A1* | 7/2016 | Li | H02J 7/00308 | |
| 2016/0241048 A1* | 8/2016 | Badam | H01M 50/207 | |
| 2017/0084961 A1* | 3/2017 | Thompson | H02J 7/0016 | |
| 2017/0346315 A1* | 11/2017 | Yang | H01M 10/48 | |
| 2018/0172772 A1* | 6/2018 | Yuan | G01R 31/389 | |
| 2019/0170802 A1* | 6/2019 | Ling | G01R 31/389 | |
| 2019/0214689 A1* | 7/2019 | Bergmann | H01M 10/482 | |
| 2019/0353693 A1* | 11/2019 | Yang | H01M 10/44 | |
| 2020/0025832 A1* | 1/2020 | Cho | G01R 31/392 | |
| 2020/0149504 A1* | 5/2020 | Vutetakis | H02H 3/087 | |
| 2020/0266645 A1* | 8/2020 | Kim | H02J 7/0029 | |
| 2020/0376978 A1* | 12/2020 | Chen | H01M 10/44 | |
| 2021/0111568 A1* | 4/2021 | Cho | G01R 31/52 | |
| 2021/0239766 A1* | 8/2021 | Talukdar | G01R 31/392 | |
| 2021/0265674 A1* | 8/2021 | Doczy | G01R 31/396 | |
| 2021/0300206 A1* | 9/2021 | Martinsson | H02J 7/0019 | |
| 2022/0037909 A1* | 2/2022 | Yang | H02J 7/0048 | |
| 2022/0176845 A1* | 6/2022 | Lee | G01R 31/3842 | |
| 2022/0187383 A1* | 6/2022 | Hendrickson | H02J 7/005 | |
| 2022/0196748 A1* | 6/2022 | Hao | H01M 10/4285 | |
| 2022/0255153 A1* | 8/2022 | Kim | G01R 31/396 | |
| 2022/0268856 A1* | 8/2022 | Kim | G01R 31/3842 | |
| 2022/0352737 A1* | 11/2022 | Wang | H01M 10/48 | |
| 2022/0368138 A1* | 11/2022 | Nishioka | H02J 7/0016 | |
| 2023/0037217 A1* | 2/2023 | Zhu | B60L 58/16 | |
| 2023/0086915 A1* | 3/2023 | Tian | G01R 31/3842 | 324/432 |
| 2023/0184845 A1* | 6/2023 | Lim | G01R 31/382 | 324/426 |
| 2023/0194616 A1* | 6/2023 | Lee | G01R 31/3835 | 324/426 |
| 2023/0324473 A1* | 10/2023 | Liu | G01R 31/52 | 324/426 |
| 2023/0384392 A1* | 11/2023 | Kwak | H02J 7/0048 | |
| 2023/0400518 A1* | 12/2023 | Lee | G01R 31/392 | |
| 2024/0222718 A1* | 7/2024 | Doczy | B60L 58/16 | |

* cited by examiner

METHOD FOR EARLY DETECTION OF AN INTERNAL SHORT IN A BATTERY PACK

INTRODUCTION

The subject disclosure relates to a system and method for preventing thermal runaway in battery packs and, in particular, to detecting internal short circuits based on charging and discharging characteristics.

An electrical vehicle operates using a battery pack having a plurality of battery cells. In general, a battery cell includes an anode, cathode and an insulating material between the anode and cathode. A short through the material can lead to cell discharge. A feedback loop can then occur in which the current in the short circuit causes an increase in temperature of the battery cell, which reduces internal short resistance, allowing for an increase in the current through the short circuit. This feedback loop can lead to a heating situation, known as thermal runaway or TRA and battery failure. Accordingly, it is desirable to locate battery cells having internal shorts so that preventative action can be taken before battery failure can occur.

SUMMARY

In one exemplary embodiment, a method of detecting an internal short in a battery pack of a vehicle is disclosed. The method includes discharging the battery pack to identify a first set of battery cells of the battery pack based on states of charge of the first set of battery cells, charging the battery pack to identify a second set of battery cells of the battery pack based on states of charge of the second set of battery cells, and generating an alarm when an intersection of the first set of battery cells and the second set of battery cells is non-empty.

In addition to one or more of the features described herein, a battery cell is a member of the intersection of the first set of battery cells and the second set of battery cells when the battery cell has the internal short. The method further includes identifying a battery cell as a member of the first set of battery cells when a discharge rate of the battery cell is greater than an average discharge rate for the battery pack. The method further includes identifying a battery cell as a member of the second set of battery cells when a charge rate of the battery cell is less than an average charge rate for the battery pack. The method further includes reporting a number of battery cells in the intersection of the first set of battery cells and the second set of battery cells. The method further includes discharging the battery pack and charging the battery pack while the vehicle is operating. The method further includes determining whether the battery pack is discharging or charging based on a sign of a current from the battery pack.

In another exemplary embodiment, a system for detecting an internal short in a battery pack of a vehicle is disclosed. The system includes a plurality of sensors and a processor. The plurality of sensors obtains states of charge at battery cells of the battery pack. The processor is configured to discharge the battery pack to identify a first set of battery cells based on the states of charge of the first set of battery cells, charge the battery pack to identify a second set of battery cells based on the states of charge of the second set of battery cells, and generate an alarm when an intersection of the first set of battery cells and the second set of battery cells is non-empty.

In addition to one or more of the features described herein, a battery cell is a member of the intersection of the first set of battery cells and the second set of battery cells when the battery cell has an internal short. The processor is further configured to identify a battery cell as a member of the first set of battery cells when a charge rate of the battery cell is less than an average discharge rate for the battery pack. The processor is further configured to identify a battery cell as a member of the second set of battery cells when a discharge rate of the battery cell is greater than an average charge rate for the battery pack. The processor is further configured to report a number of battery cells in the intersection of the first set of battery cells and the second set of battery cells. The processor is further configured to discharge the battery pack and charge the battery pack while the vehicle is operating. The processor is further configured to determine whether the battery pack is discharging or charging based on a sign of a current from the battery pack.

In yet another exemplary embodiment, a vehicle is disclosed. The vehicle includes a plurality of sensors and a processor. The plurality of sensors obtains states of charge at battery cells of a battery pack of the vehicle. The processor is configured to discharge the battery pack to identify a first set of battery cells based on the states of charge of the first set of battery cells, charge the battery pack to identify a second set of battery cells based on the states of charge of the second set of battery cells, and generate an alarm when an intersection of the first set of battery cells and the second set of battery cells is non-empty.

In addition to one or more of the features described herein, a battery cell is a member of the intersection of the first set of battery cells and the second set of battery cells when the battery cell has an internal short. The processor is further configured to identify a battery cell as a member of the first set of battery cells when a charge rate of the battery cell is less than an average discharge rate for the battery pack. The processor is further configured to identify a battery cell as a member of the second set of battery cells when a discharge rate of the battery cell is greater than an average charge rate for the battery pack. The processor is further configured to report a number of battery cells in the intersection of the first set of battery cells and the second set of battery cells. The processor is further configured to discharge the battery pack and charge the battery pack while the vehicle is operating.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

Figure 1:
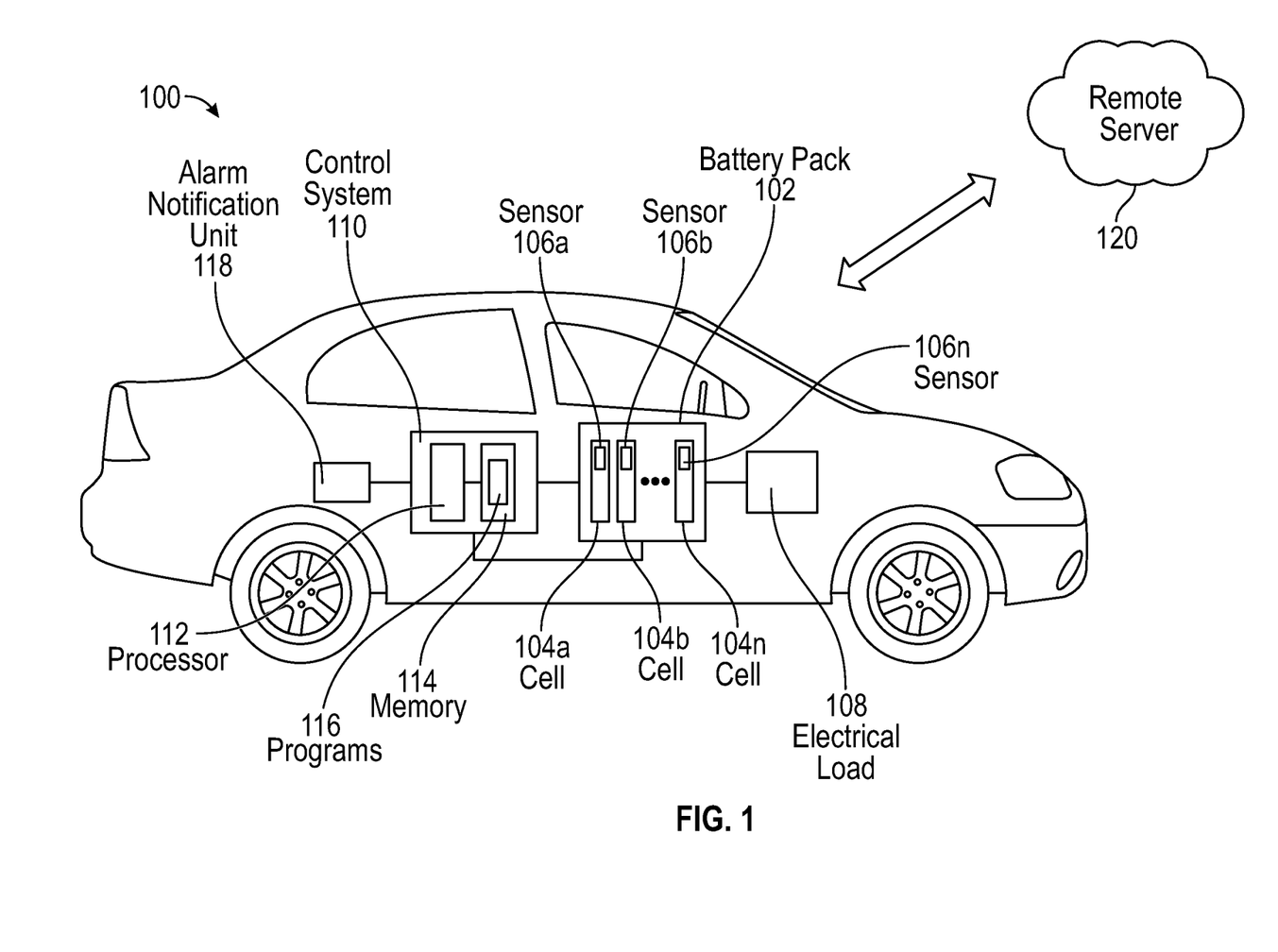
FIG. 1 shows an electric vehicle in an embodiment.

In accordance with an exemplary embodiment, FIG. 1 shows an electric vehicle 100. The electric vehicle 100 includes a battery pack 102, an electrical load 108 which operates using electricity supplied by the battery pack, and a control system 110 that monitors the battery pack. The battery pack 102 includes a plurality of battery cells 104a, ..., 104n. A plurality of sensors 106a, ..., 106n obtain voltage and current measurements from the plurality of battery cells 104a, ..., 104n, respectively, and transmit the voltage and current measurements to the control system 110. In various embodiments, the plurality of sensors 106a, ..., 106n is a plurality of voltmeters and current meters or ammeters. The measured voltage and current on a battery cell can be converted into a state of charge (SOC) for the battery cell. In various embodiments, the voltages and currents can be measured at different times to determine SOC at a first time and SOC at second time. The change in the state of charge between the first time and the second time can be used to determine a discharge rate or a charge rate for the battery cell. The discharge rate and the charge rate are each indicated by a slope, which is given by a difference in the SOC measurements at the first time and second time divided by a time interval between the measurements.

The electrical load 108 can include a motor of the electric vehicle 100 and/or other electrical components, such as dashboard lights, exterior lights, entertainment systems, etc. The control system 110 includes a processor 112 and a memory storage device 114 having various programs or instructions 116 stored therein. The processor 112 can access the programs or instructions from the memory storage device 114 and run the programs or instructions to perform the various calculations and operations disclosed herein for detecting battery cells having internal shorts and generating an appropriate alarm or taking an appropriate action.

The control system 110 is in communication with an alarm notification unit 118 and can notify the alarm notification unit when a battery cell having an internal short is detected. In an embodiment, the alarm notification unit 118 can transmit a notification signal to a remote server 120 such as OnStar®. The remote server 120 can send the notification signal to vehicle dealers, vehicle manufacturers and/or safety and service personnel to provide an early notice or warning to check on safety issues for the vehicle or vehicle model. In case of severe shortage issues, the alarm notification can be submitted to local emergency units such as firefighters. In other embodiments, the alarm notification unit 118 can provide a visual signal to a driver of the vehicle or sound an alarm. In various embodiments, rather than generating an alarm, data can be sent to the remote server 120 at a later time for processing and review.

Figure 2:
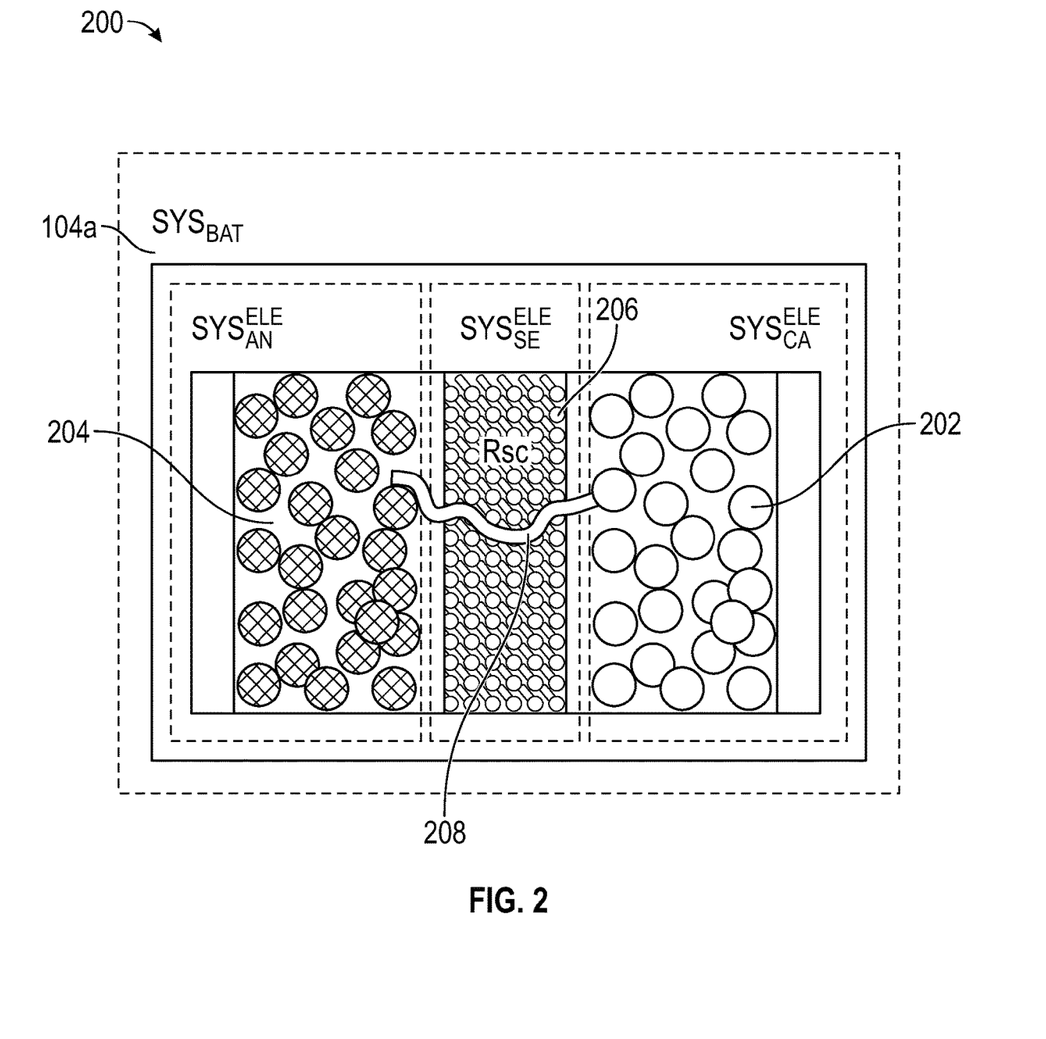
FIG. 2 shows a schematic diagram of a battery cell of the electrical vehicle.

FIG. 2 shows a schematic diagram 200 of a battery cell (e.g., battery cell 104a). The battery cell 104a includes a cathode 202, an anode 204 and an insulating medium 206 separating the cathode from the anode. In normal operation, the insulating medium 206 prevents a current from flowing between the cathode 202 and the anode 204. The schematic diagram 200 also shows a short circuit 208 through the insulating medium 206 that can occur due to manufacturing defects or degradation of the insulating medium or through excessive use of the battery cell 104a.

The battery cell 104a can be in any number of conditions, such as healthy, weak or impaired. In a new cell, the insulating medium 206 fully isolates the cathode 202 from the anode 204, which operates at full capacity. In a weak cell, the insulating medium 206 fully isolates the cathode 202 from the anode 204, but the cathode and anode do not operate at full capacity due to a diminution in their ability to retain charge. In an impaired cell, an internal short through the insulating medium 206 causes discharge between cathode 202 and anode 204 through the insulating medium. The rate at which a battery cell discharges and charges depends on its condition. These discharge and charge rates can therefore be used to identify impaired cells, as discussed herein with respect to FIGS. 3 and 4.

Figure 3:
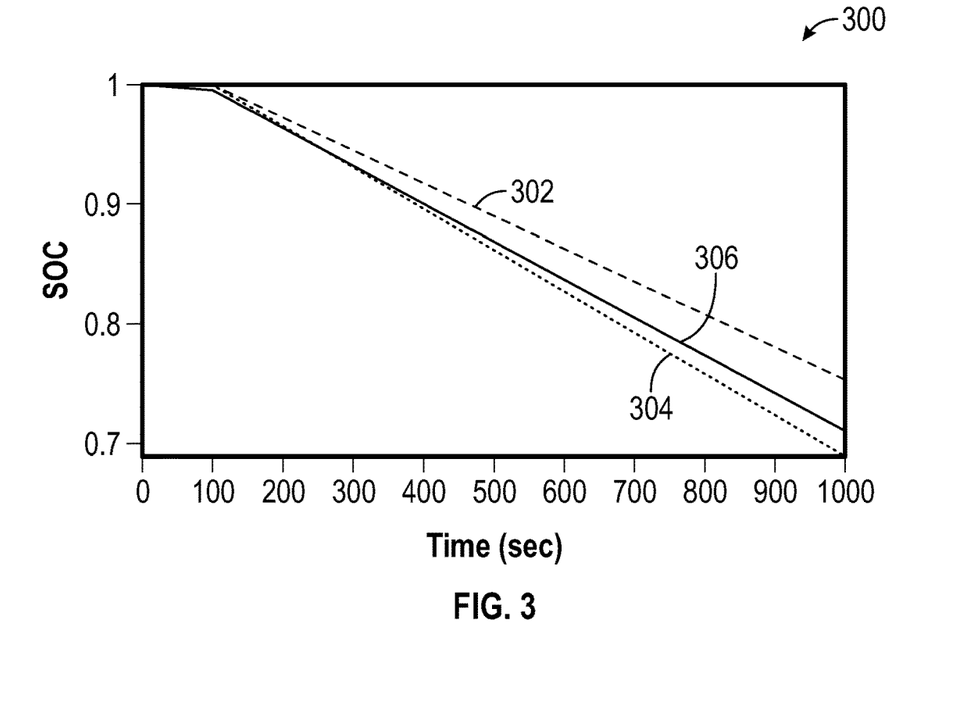
FIG. 3 shows a graph illustrating discharge rates for battery cells in various conditions.

FIG. 3 shows a graph 300 illustrating a discharge rate for battery cells that are in various conditions. Time is shown in seconds along the abscissa and the state of charge (SOC) is shown along ordinate axis. The state of charge is shown as a ratio. Therefore, an SOC of 1 indicates a fully charged battery cell and an SOC of 0 indicates a fully discharged battery cell. Discharge curves are shown for three conditions of battery cells: healthy cells, weak cells and impaired cells.

A first discharge curve 302 illustrates a first discharge rate for healthy cell. A second discharge curve 304 illustrates a second discharge rate for a weak cell. A third discharge curve 306 illustrates a third discharge rate for an impaired cell. Cells are shown in graph 300 as beginning at fully charged, with discharge beginning at 100 seconds. At about 900 seconds, a healthy cell (first discharge curve 302) discharges to about 75% of full charge, a weak cell (second discharge curve 304) discharges to about 69% of full charge, and an impaired cell (third discharge curve 306) discharges to about 71% of full charge. As evident from graph 300, weak cells and impaired cells discharge faster than new cells.

Figure 4:
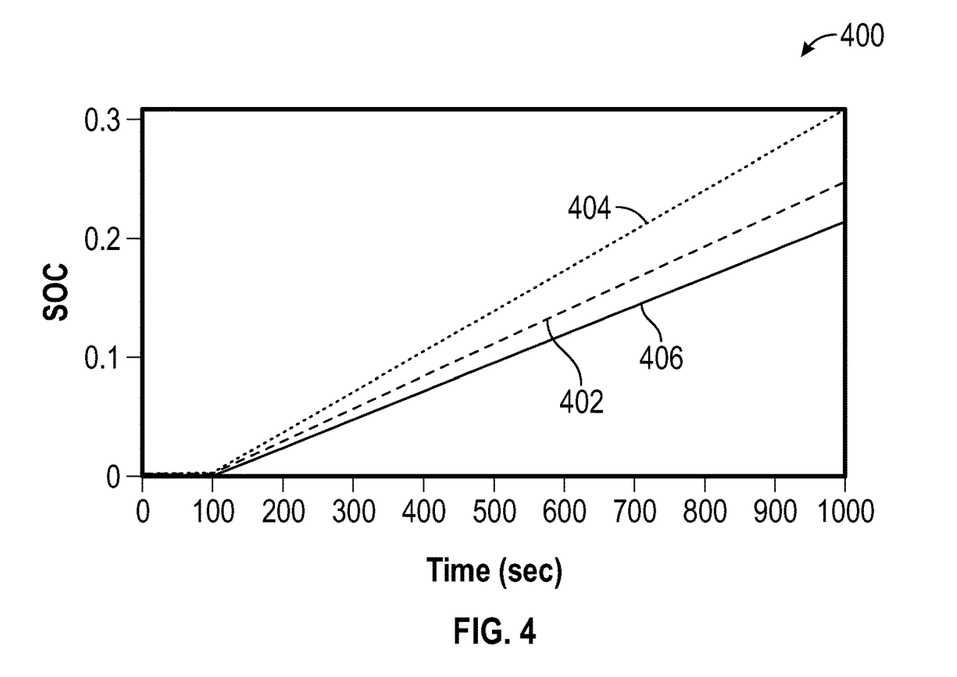
FIG. 4 shows a graph illustrating charge rates for the battery cells in various conditions.

FIG. 4 shows a graph 400 illustrating a charge rate for the battery cells shown in FIG. 3. Time is shown in seconds along the abscissa and the state of charge (SOC) is shown along ordinate axis. A first charge curve 402 illustrates a first charge rate for a healthy cell. A second charge curve 404 illustrates a second charge rate for a weak cell. A third charge curve 406 illustrates a third charge rate for an impaired cell with a minor internal short. Each cell starts at zero charge, with charging commencing at about 100 seconds. At about 900 seconds, the healthy cell (first charge curve 402) charges to about 25% of full charge, the weak cell (second charge curve 404) charges to about 31% of full charge, and the impaired cell (third charge curve 406) charges to about 21% of full charge. As evident from graph 400, weak cells charge faster than the healthy cells while impaired cells charge slower than healthy cells.

Figure 5:
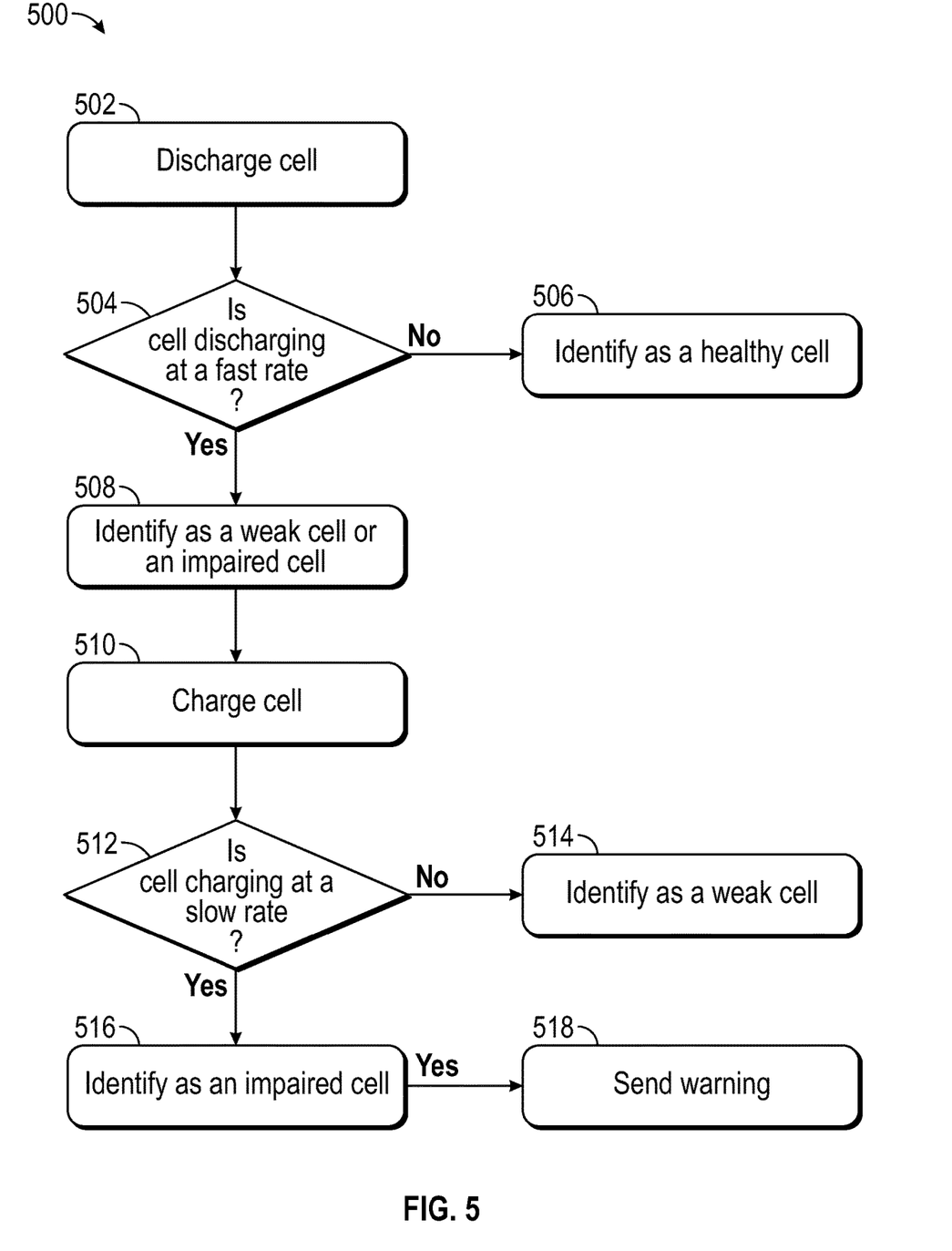
FIG. 5 shows a flowchart of a method for identifying an impaired battery cell, in an embodiment.

FIG. 5 shows a flowchart 500 of a method for identifying an impaired battery cell, in an embodiment. In box 502, a cell is discharged and a discharge rate for the cell is measured. In box 504, a decision is made based on the discharge rate. If the discharge rate is slow, then the cell is identified as a healthy cell in box 506. If the discharge rate is fast, then the cell is identified as one of a group that includes a weak cell or an impaired cell in box 508. In box 510, the cell is charged. In box 512, a decision is made based on the charge rate. If the charge rate is fast, then the cell is identified as a weak cell in box 514. If the charge rate is slow, then the cell is identified as an impaired cell in box 516. In box 518, a warning is sent based on the identification of an impaired cell in box 516.

In various embodiments, the discharge rate of a cell under test is determined by comparing its discharge rate to that of its neighboring cells. Neighboring cells are considered new or healthy on the whole. Therefore, if the discharge rate of a cell under test is the same as an average discharge rate of its neighboring cells, then it is considered a healthy cell. In various embodiments, an average discharge rate of the neighboring cells can be obtained and a criterion or threshold with respect to the average discharge rate can be established. The cell under test is considered the same as its neighboring cells when it is within the threshold. In various embodiments, the threshold can be a standard deviation with respect to the average discharge rate or a selected multiple of the standard deviation. If the discharge rate of the cell under test is less than the average discharge rate of its neighboring cells, then it is considered to be either a weak cell or an impaired cell. The discharge rate can be considered less than that of its neighboring cells when the value of its slope is outside of the threshold defined with respect to the average discharge rate.

Similarly, the charge rate of a cell under test is determined by comparing its charge rate to that of neighboring cells. If the charge rate of the cell under test is greater than the average charge rate of its neighboring cells (i.e., greater than an upper threshold defined with respect to the average charging rate), then it is considered a weak cell. If the charge rate of the cell under test is less than that of its neighboring cells (i.e., less than a lower threshold defined with respect to the average charge rate), then it is considered to be an impaired cell.

Figure 6:
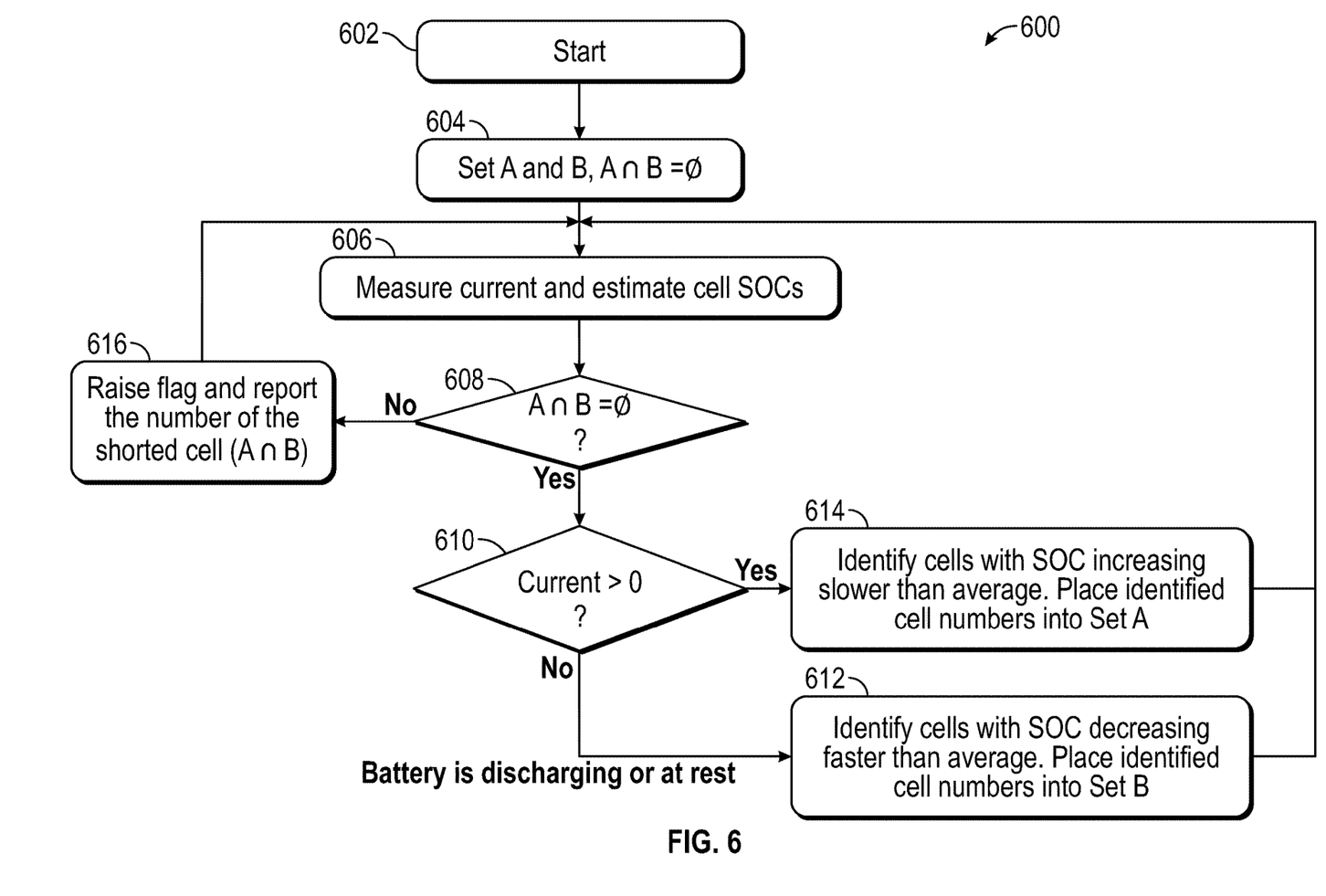
FIG. 6 shows a flowchart of a method for determining a presence of an impaired battery cell within a battery pack.

FIG. 6 shows a flowchart 600 of a method for determining a presence of an impaired battery cell within a battery pack. The method starts in box 602. In box 604, two sets are created. A first set of battery cells (Set A) represents battery cells that have a charge rate that is slower than an average discharge rate for the battery pack during a charge event. A second set of battery cells (Set B) represents cells that have a discharge rate that is faster than an average charge rate for the battery pack during a discharge event. At the beginning (i.e., before any testing has been performed), Set A and Set B are empty sets. Consequently, the intersection of Set A and Set B is the empty set (A∩B=Ø).

In box 606, the current and the SOC of the battery cells are measured. The current indicates whether the cells are charging or discharging. In box 608, a check is made to determine whether the intersection of Set A and Set B is still the empty set. If the intersection is not empty, the method proceeds to box 616 and a warning signal is generated. The warning indicates the number of cells that are in the intersection of Set A and Set B. The method then proceeds back to box 606 and obtains additional measurements of current and SOC. Back at box 608, if the intersection is the empty set, the method proceeds to box 610.

At box 610, the sign of the current is checked. If the current is less than or equal to zero (i.e., cells are discharging or at rest), then the method proceeds to box 612. If instead the current is greater than zero (i.e., cells are charging), then the method proceeds to box 614. In box 612, cells that are discharging faster than an average discharge rate of the battery pack are placed into Set B. In box 614, cells that are charging slower than an average charge rate of the battery pack are placed into Set A. From either box 612 or box 614, the method proceeds to box 606 for further measurements.

After proceeding through either of the box 612 and box 614 at least one time, the test at box 608 is able to identify impaired cells. These impaired cells will be members of both Set A (i.e., slow charge rate) and Set B (i.e., fast discharge rate). The intersection of Set A Set A and Set B therefore includes impaired cells. When the intersection of Set A and Set B is non-empty, the method proceeds to box 616, in which an alarm is generated. At box 616, the number of impaired battery cells can also be reported.

Figure 7:
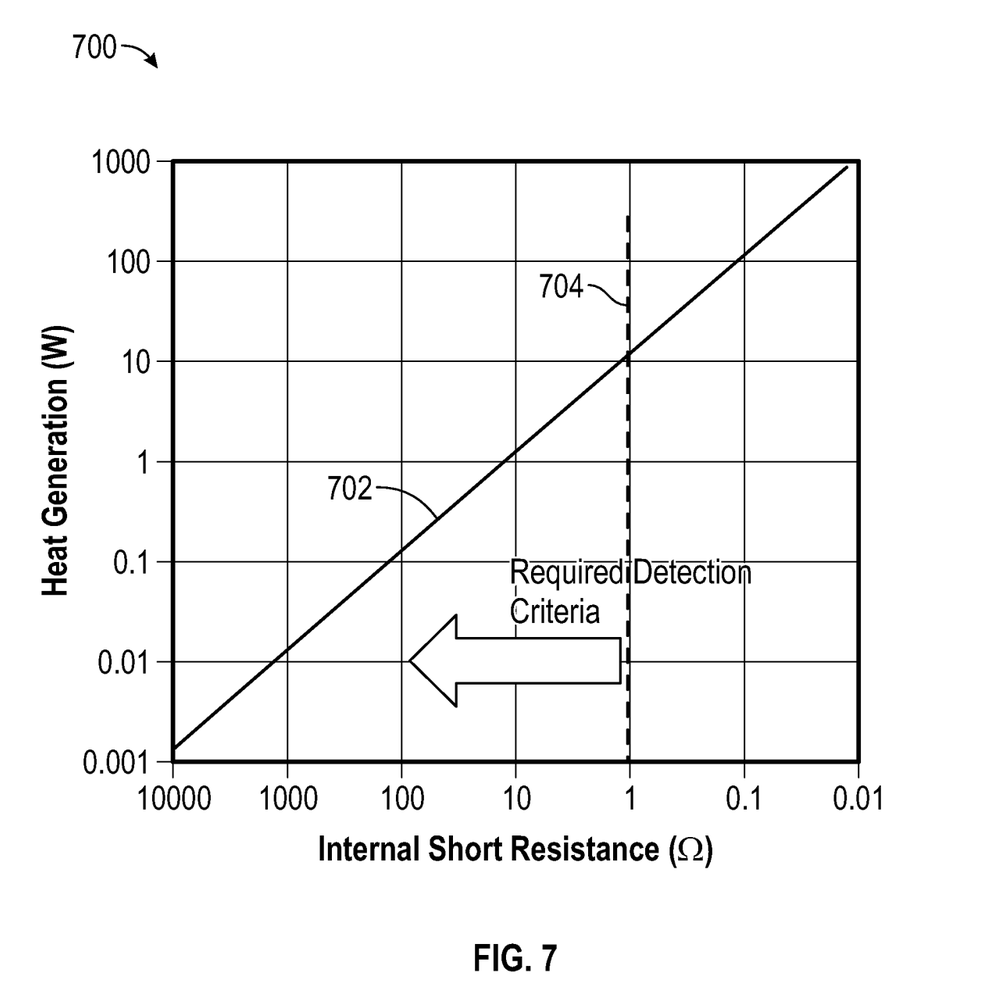
FIG. 7 shows a relation between heat generation in a battery cell and internal short resistance.

FIG. 7 shows a relation 700 between heat generation in a battery cell and internal short resistance. Internal short resistance is shown in ohms along the abscissa and heat is shown in Watts along the ordinate axis. As shown by line 702, the amount of heat generated by a shorted or impaired battery cell increases as the resistance of the short decreases. Threshold resistance 704 indicates a resistance above which heat leads to thermal runaway. When a resistance of the short is greater than about one ohm, the amount of heat generated does not lead to thermal runaway. However, when the resistance of the short is less than about one ohm, the resulting heat generated can lead to thermal runaway. Therefore, it is desirable to detect impaired battery cells when the resistance of any shorts therein is still greater than about one ohm. The method disclosed herein detects the presence of shorts when the internal short resistance is above about 1 to 2 ohms.

The methods disclosed herein can be performed without requiring the vehicle to be turned off or left idle. In various embodiments, impaired battery cells can be identified and replaced before thermal runaway can occur.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of detecting an internal short in a battery pack of a vehicle, comprising:
    discharging the battery pack to identify a first set of impaired battery cells of the battery pack based on a discharge rate of the first set of impaired battery cells being greater than an average discharge rate for the battery pack, wherein the discharge rate of an impaired battery cell is from full charge to about 71% of full charge in 900 seconds;
    charging the battery pack to identify a second set of impaired battery cells of the battery pack based on a charge rate of the second set of impaired battery cells being less than an average charge rate for the battery pack, wherein the charge rate of the impaired battery cell is from zero charge to about 21% of full charge in 900 seconds;
    identifying a battery cell having an internal short when the battery cell is in an intersection of the first set of impaired battery cells and the second set of impaired battery cells; and
    generating an alarm when the battery cell having the internal short is identified.

2. The method of claim 1, wherein a battery cell is a member of the intersection of the first set of impaired battery cells and the second set of impaired battery cells when the battery cell has the internal short.

3. The method of claim 1, wherein the alarm includes number of battery cells in the intersection of the first set of impaired battery cells and the second set of impaired battery cells.

4. The method of claim 1, further comprising discharging the battery pack and charging the battery pack while the vehicle is operating.

5. The method of claim 1, further comprising determining whether the battery pack is discharging or charging based on a sign of a current from the battery pack.

6. A system for detecting an internal short in a battery pack of a vehicle, comprising:
a plurality of sensors for obtaining states of charge of battery cells of the battery pack; and
a processor configured to:
discharge the battery pack to identify a first set of impaired battery cells based on a discharge rate of the first set of impaired battery cells being greater than an average discharge rate for the battery pack, wherein the discharge rate of an impaired battery cell is from full charge to about 71% of full charge in 900 seconds;
charge the battery pack to identify a second set of impaired battery cells based on a charge rate of the second set of impaired battery cells being less than an average charge rate for the battery pack, wherein the charge rate of the impaired battery cell is from zero charge to about 21% of full charge in 900 seconds;
identify a battery cell having an internal short when the battery cell is in an intersection of the first set of impaired battery cells and the second set of impaired battery cells; and
generate an alarm when the battery cell having the internal short is identified.

7. The system of claim 6, wherein a battery cell is a member of the intersection of the first set of impaired battery cells and the second set of impaired battery cells when the battery cell has an internal short.

8. The system of claim 6, wherein the alarm includes a number of battery cells in the intersection of the first set of impaired battery cells and the second set of impaired battery cells.

9. The system of claim 6, wherein the processor is further configured to discharge the battery pack and charge the battery pack while the vehicle is operating.

10. The system of claim 6, wherein the processor is further configured to determine whether the battery pack is discharging or charging based on a sign of a current from the battery pack.

11. A vehicle, comprising:
a plurality of sensors for obtaining states of charge of battery cells of a battery pack of the vehicle; and
a processor configured to:
discharge the battery pack to identify a first set of impair battery cells based on a discharge rate of the first set of impaired battery cells being greater than an average discharge rate for the battery pack, wherein the discharge rate of an impaired battery cell is from full charge to about 71% of full charge in 900 seconds;
charge the battery pack to identify a second set of impaired battery cells based on a charge rate of the second set of impaired battery cells being less than an average charge rate for the battery pack, wherein the charge rate of the impaired battery cell is from zero charge to about 21% of full charge in 900 seconds;
identify a battery cell having an internal short when the battery cell is in an intersection of the first set of impaired battery cells and the second set of impaired battery cells; and
generate an alarm when the battery cell having the internal short is identified.

12. The vehicle of claim 11, wherein a battery cell is a member of the intersection of the first set of impaired battery cells and the second set of impaired battery cells when the battery cell has an internal short.

13. The vehicle of claim 11, wherein the alarm includes a number of battery cells in the intersection of the first set of impaired battery cells and the second set of impaired battery cells.

14. The vehicle of claim 11, wherein the processor is further configured to discharge the battery pack and charge the battery pack while the vehicle is operating.

15. The method of claim 1, further comprising detecting the internal short when the internal short resistance is above about one ohm.

16. The method of claim 1, further comprising comparing the discharge rate of the battery cell to an average discharge rate of its neighboring cells and comparing the charge rate of the battery cell to an average charge rate of its neighboring cells.

17. The system of claim 6, wherein the processor is further configured to detect the internal short when the internal short resistance is above about one ohm.

18. The system of claim 6, wherein the processor is further configured to compare the discharge rate of the battery cell to an average discharge rate of its neighboring cells and compare the charge rate of the battery cell to an average charge rate of its neighboring cells.

19. The vehicle of claim 11, wherein the processor is further configured to detect the internal short when the internal short resistance is above about one ohm.

20. The vehicle of claim 11, wherein the processor is further configured to compare the discharge rate of the battery cell to an average discharge rate of its neighboring cells and compare the charge rate of the battery cell to an average charge rate of its neighboring cells.

* * * * *